(12) United States Patent
Chak

(10) Patent No.: US 9,385,705 B2
(45) Date of Patent: Jul. 5, 2016

(54) H-BRIDGE GATE CONTROL CIRCUIT

(71) Applicant: AvantWave Limited, Hong Kong (HK)

(72) Inventor: Chu Kwong Chak, Hong Kong (HK)

(73) Assignee: AVANTWAVE LIMITED, Hong Kong (HK)

( * ) Notice: Subject to any disclaimer, the term of this patent is extended or adjusted under 35 U.S.C. 154(b) by 154 days.

(21) Appl. No.: 14/501,075

(22) Filed: Sep. 30, 2014

(65) Prior Publication Data

US 2015/0097617 A1    Apr. 9, 2015

Related U.S. Application Data

(60) Provisional application No. 61/886,677, filed on Oct. 4, 2013.

(51) Int. Cl.
*H03K 5/15* (2006.01)
*H03K 17/28* (2006.01)
*H03K 17/16* (2006.01)
*H03K 17/567* (2006.01)
*H03K 5/156* (2006.01)
*H03K 17/687* (2006.01)

(52) U.S. Cl.
CPC .............. *H03K 17/28* (2013.01); *H03K 17/162* (2013.01); *H03K 5/15* (2013.01); *H03K 5/1565* (2013.01); *H03K 17/567* (2013.01); *H03K 17/687* (2013.01); *H03K 17/6871* (2013.01); *H03K 2217/0063* (2013.01); *H03K 2217/0072* (2013.01)

(58) Field of Classification Search
None
See application file for complete search history.

(56) References Cited

U.S. PATENT DOCUMENTS

| 4,950,919 | A * | 8/1990 | Rossi | H03K 17/6871 327/401 |
| 8,228,111 | B2 * | 7/2012 | Quinn | H03F 1/0211 327/333 |
| 8,638,158 | B2 * | 1/2014 | Morishita | H04L 25/0276 324/424 |
| 8,674,747 | B2 * | 3/2014 | Iwasaki | H03K 19/018571 327/108 |
| 2006/0132231 | A1 * | 6/2006 | Ishii | H03F 1/0211 330/10 |
| 2009/0267640 | A1 * | 10/2009 | Kuzmenka | H04L 25/03343 326/30 |
| 2011/0221481 | A1 * | 9/2011 | Kifuku | H03K 17/04123 327/109 |
| 2014/0285130 | A1 * | 9/2014 | Inoue | H02P 6/085 318/400.29 |

* cited by examiner

*Primary Examiner* — Tuan T Lam

(57) ABSTRACT

A gate control circuit for controlling gates of at least a half side of an H-bridge circuit includes: an input terminal configured to connect to a PWM signal; a power terminal configured to connect to a voltage source that supplies a positive voltage; a ground terminal configured to connect to a ground reference; and a control circuit connected with the input terminal, the power terminal, and the ground terminal. The control circuit includes: two high side switches configured to be connected with the voltage source respectively through the power terminal; two low side switches configured to be connected with the ground reference respectively through the ground terminal; a first inverter connecting the two high side switches; a second inverter connecting the two low side switches; and a first resistor and a second resistor connecting the two high side switches to the two low side switches respectively.

20 Claims, 9 Drawing Sheets

H-BRIDGE GATE CONTROL CIRCUIT

CROSS-REFERENCE TO RELATED APPLICATIONS

This application claims the benefit of U.S. provisional patent application No. 61/886,677 filed on Oct. 4, 2013; the contents of which is hereby incorporated by reference.

FIELD OF THE PATENT APPLICATION

The present patent application generally relates to electronic circuits and more specifically to an H-bridge gate control circuit.

BACKGROUND

In general purpose electronic design, a microprocessor (MCU) is a popular choice for generating control signals to meet the timing requirements. However, there are some issues to be considered. For example, for low cost solutions, the MCU will be fully utilized for a number of tasks. The complexity of the software in the MCU will render low reliability of implementation. If the MCU is solely used for control signal generation, the cost of implementation is very high and the timer interrupt handling is required to be assigned with caution in order to achieve high reliability. High speed MCUs may be needed to achieve high speed operation, but they are relatively expensive.

SUMMARY

The present patent application is directed to a gate control circuit for controlling gates of at least a half side of an H-bridge circuit. In one aspect, the gate control circuit includes: an input terminal configured to connect to a PWM signal; a power terminal configured to connect to a voltage source that supplies a positive voltage; a ground terminal configured to connect to a ground reference; and a control circuit connected with the input terminal, the power terminal, and the ground terminal. The control circuit includes: two high side switches configured to be connected with the voltage source respectively through the power terminal; two low side switches configured to be connected with the ground reference respectively through the ground terminal; a first inverter connecting the two high side switches; a second inverter connecting the two low side switches; a first resistor and a second resistor connecting the two high side switches to the two low side switches respectively; a first capacitor connected between the power terminal and an input of the first inverter; and a second capacitor connected between the ground terminal and an input of the second inverter. One of the high side switches and one of the low side switches are respectively connected with the input terminal and configured to be controlled by the PWM signal. The high side switches are respectively open when high inputs are fed to gates thereof and closed when low inputs are fed to gates thereof, while the low side switches are respectively open when low inputs are fed to gates thereof and closed when high inputs are fed to gates thereof.

An output of the second inverter may be configured to control an upper side switch of a half side of the H-bridge circuit, while the output of the first inverter may be configured to control a lower side switch of that half side of the H-bridge circuit. An output of the second inverter may be configured to control an upper side switch of a half side of the H-bridge circuit through a first buffer, while the output of the first inverter may be configured to control a lower side switch of that half side of the H-bridge circuit through a second buffer.

Voltage at an end of the first resistor may be configured to control an upper side switch of a half side of the H-bridge circuit, voltage at an end of the second resistor may be configured to control a lower side switch of that half side of the H-bridge circuit, the first resistor and the first inverter may connect to the same switch, while the second resistor and the second inverter may connect to the same switch.

In another aspect, the present patent application provides a gate control circuit for controlling gates of at least a half side of an H-bridge circuit. The gate control circuit includes: an input terminal configured to connect to a PWM signal; a power terminal configured to connect to a voltage source that supplies a positive voltage; a ground terminal configured to connect to a ground reference; and a control circuit connected with the input terminal, the power terminal, and the ground terminal. The control circuit includes: two high side switches configured to be connected with the voltage source respectively through the power terminal; two low side switches configured to be connected with the ground reference respectively through the ground terminal; a first inverter connecting the two high side switches; a second inverter connecting the two low side switches; and a first resistor and a second resistor connecting the two high side switches to the two low side switches respectively. One of the high side switches and one of the low side switches are respectively connected with the input terminal and configured to be controlled by the PWM signal. The high side switches are respectively open when high inputs are fed to gates thereof and closed when low inputs are fed to gates thereof, while the low side switches are respectively open when low inputs are fed to gates thereof and closed when high inputs are fed to gates thereof. The high side switches, the low side switches, and the inverters are implemented by Field Effect Transistors or Bipolar Junction Transistors.

The gate control circuit may further include a first capacitor and a second capacitor. The first capacitor may be connected between the power terminal and an input of the first inverter, while the second capacitor may be connected between the ground terminal and an input of the second inverter.

An output of the second inverter may be configured to control an upper side switch of a half side of the H-bridge circuit, while the output of the first inverter may be configured to control a lower side switch of that half side of the H-bridge circuit. An output of the second inverter may be configured to control an upper side switch of a half side of the H-bridge circuit through a first buffer, while the output of the first inverter may be configured to control a lower side switch of that half side of the H-bridge circuit through a second buffer. The first and second buffers may be direct lines or gate drivers.

Voltage at an end of the first resistor may be configured to control an upper side switch of a half side of the H-bridge circuit, voltage at an end of the second resistor may be configured to control a lower side switch of that half side of the H-bridge circuit, the first resistor and the first inverter may connect to the same switch, while the second resistor and the second inverter may connect to the same switch.

Voltage at an end of the first resistor may be configured to control an upper side switch of a half side of the H-bridge circuit through a first buffer, while voltage at an end of the second resistor may be configured to control a lower side switch of that half side of the H-bridge circuit through a second buffer.

In yet another aspect, the present patent application provides a gate control circuit for controlling gates of at least a half side of an H-bridge circuit. The gate control circuit includes: an input terminal configured to connect to a PWM signal; a power terminal configured to connect to a voltage source that supplies a positive voltage; a ground terminal configured to connect to a ground reference; and a control circuit connected with the input terminal, the power terminal, and the ground terminal. The control circuit includes: two high side switches configured to be connected with the voltage source respectively through the power terminal; two low side switches configured to be connected with the ground reference respectively through the ground terminal; a first inverter connecting the two high side switches; a second inverter connecting the two low side switches; and a first resistor and a second resistor connecting the two high side switches to the two low side switches respectively. One of the high side switches and one of the low side switches are respectively connected with the input terminal and configured to be controlled by the PWM signal.

The high side switches may be respectively open when high inputs are fed to gates thereof and closed when low inputs are fed to gates thereof, while the low side switches may be respectively open when low inputs are fed to gates thereof and closed when high inputs are fed to gates thereof.

The high side switches, the low side switches, and the inverters may be implemented by Field Effect Transistors or Bipolar Junction Transistors. The gate control circuit may further include a first capacitor and a second capacitor. The first capacitor may be connected between the power terminal and an input of the first inverter, while the second capacitor may be connected between the ground terminal and an input of the second inverter.

An output of the second inverter may be configured to control an upper side switch of a half side of the H-bridge circuit, while the output of the first inverter may be configured to control a lower side switch of that half side of the H-bridge circuit. An output of the second inverter may be configured to control an upper side switch of a half side of the H-bridge circuit through a first buffer, while the output of the first inverter may be configured to control a lower side switch of that half side of the H-bridge circuit through a second buffer.

Voltage at an end of the first resistor may be configured to control an upper side switch of a half side of the H-bridge circuit, voltage at an end of the second resistor may be configured to control a lower side switch of that half side of the H-bridge circuit, the first resistor and the first inverter may connect to the same switch, while the second resistor and the second inverter may connect to the same switch.

Voltage at an end of the first resistor may be configured to control an upper side switch of a half side of the H-bridge circuit through a first buffer, while voltage at an end of the second resistor may be configured to control a lower side switch of that half side of the H-bridge circuit through a second buffer. The first and second buffers may be direct lines or gate drivers.

BRIEF DESCRIPTIONS OF THE DRAWINGS

DETAILED DESCRIPTION

Reference will now be made in detail to a preferred embodiment of the H-bridge gate control circuit disclosed in the present patent application, examples of which are also provided in the following description. Exemplary embodiments of the H-bridge gate control circuit disclosed in the present patent application are described in detail, although it will be apparent to those skilled in the relevant art that some features that are not particularly important to an understanding of the H-Bridge gate control circuit may not be shown for the sake of clarity.

Furthermore, it should be understood that the H-bridge gate control circuit disclosed in the present patent application is not limited to the precise embodiments described below and that various changes and modifications thereof may be effected by one skilled in the art without departing from the spirit or scope of the protection. For example, elements and/or features of different illustrative embodiments may be combined with each other and/or substituted for each other within the scope of this disclosure.

Figure 1:
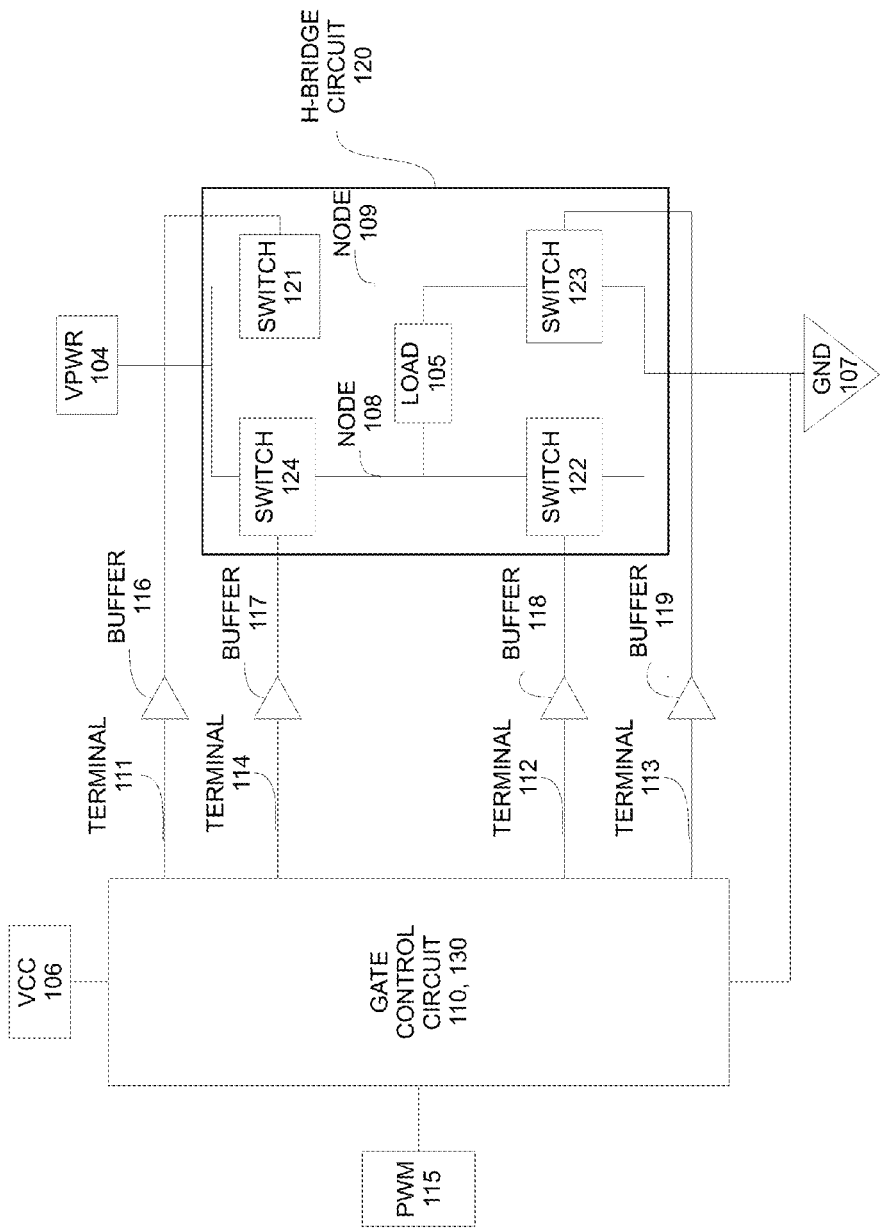
FIG. 1 is a schematic circuit diagram of an H-bridge circuit with a gate control circuit according to an embodiment of the present patent application.
Figure 2:
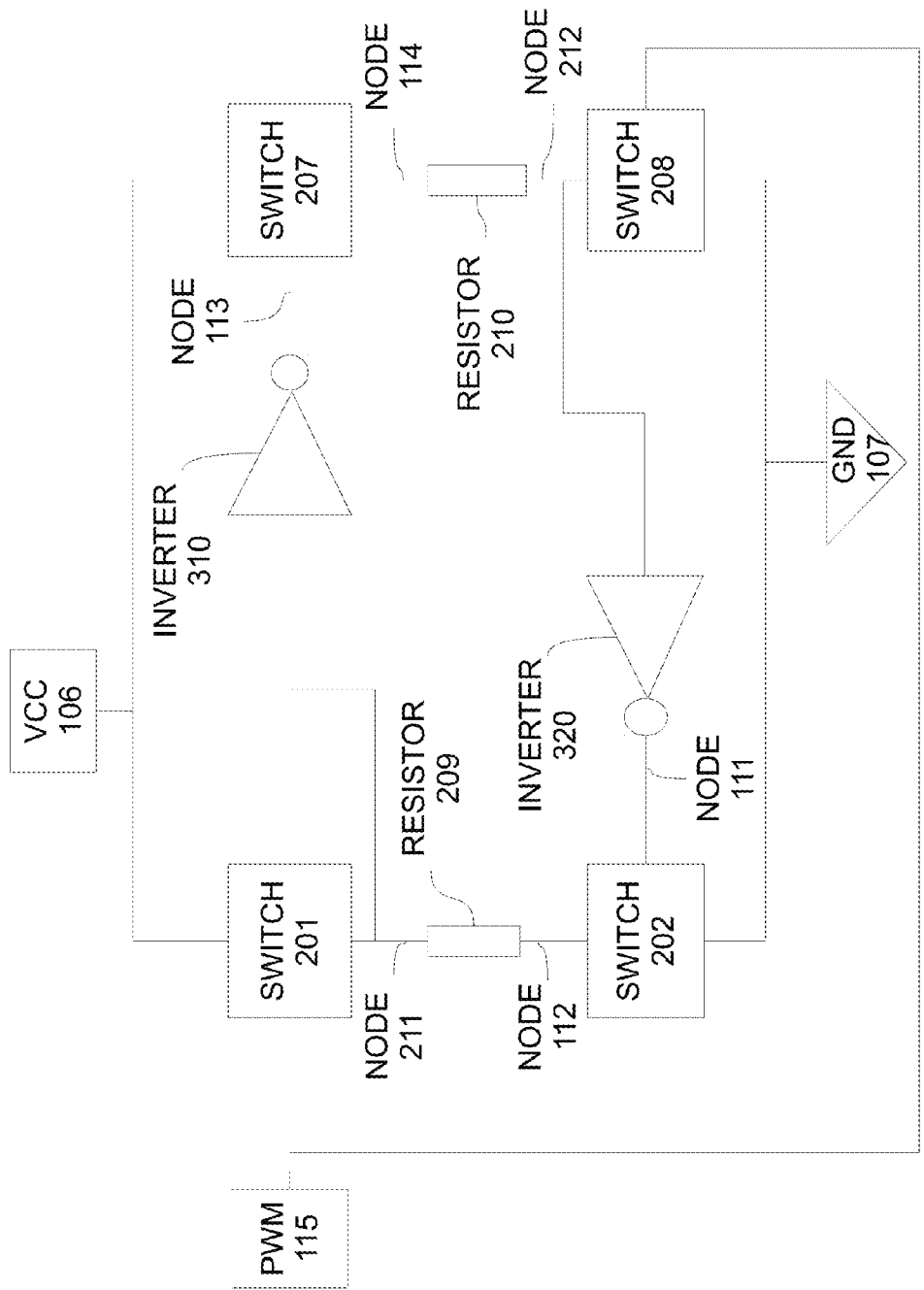
FIG. 2 is a schematic circuit diagram of the gate control circuit according to an embodiment of the present patent application.

FIG. 1 is a schematic circuit diagram of an H-bridge circuit 120 with a gate control circuit 110 or 130 according to an embodiment of the present patent application. Referring to FIG. 1, the gate control circuit 110 or 130 includes: four output terminals 111, 114, 112 and 113 respectively configured to connect to two high sides (i.e. switches 121 and 124) and two low sides (i.e. switches 122 and 123) of an H-bridge circuit 120 (via optional gate buffers 116, 117, 118 and 119); an input terminal configured to connect to a PWM signal 115; a power terminal configured to connect to a voltage source VPWR 104 that supplies a positive voltage; a ground terminal configured to connect to a ground reference GND 107; and a control circuit (as shown in FIG. 2 in more detail) configured to be connected with the PWM signal 115, the voltage source VCC 106, the ground reference GND 107 and the H-bridge circuit 120 through the above-mentioned terminals. The PWM signal 115 is a pulse width modulation PWM signal. The ON PWM duty cycle plus OFF PWM duty cycle is the PWM period.

Referring to FIG. 1, the operation of the H-bridge circuit 120 is performed by closing and opening four switches 121, 122, 123, and 124. When the switches 123 and 124 are closed while the switch 121, 122 are open, load 105 is applied with a positive voltage at node 108 with respective to node 109. On the other hand, when the switch 121 and 122 are closed while the switch 123, 124 are open, the load 105 is applied with a negative voltage at the node 108 with respective to the node 109.

However, either the case when the switches 122 are 124 are closed at the same time or the case when the switches 121 and 123 are closed at the same time will cause a shooting-through current, which is an excessive current that may damage the switches.

Referring to FIG. 1, the gate control circuit 110 or 130 with a single input PWM signal 115 is configured to prevent the H-bridge circuit 120 from having a shooting-through current by generating the control signals at the terminals 111, 112, 113 and 114 with relative timing for the gates of the switches 121, 122, 123 and 124 of the H-Bridge 120 via the buffers 116, 118, 119, 117 respectively.

FIG. 2 is a schematic circuit diagram of the gate control circuit 110 according to an embodiment of the present patent application. Referring to FIG. 2, the gate control circuit 110 includes: two high side switches 201 and 207 configured to be connected with the voltage source VCC 106 respectively through the power terminal; two low side switches 202 and 208 configured to be connected with the ground reference GND 107 respectively through the ground terminal; a first inverter 310 connecting the two high side switches 201 and 207; a second inverter 320 connecting the two low side switches 202 and 208; and two resistors 209 and 210 connecting the two high side switches 201 and 207 to the two low side switches 202 and 208. The two switches 201, 208 are configured to be connected with the PWM signal 115.

The high side switches 201 and 207 are respectively open when high inputs are fed to their gates and closed when low inputs are fed to their gates. The low side switches 202 and 208 are respectively open when low inputs are fed to their gates and closed when high inputs are fed to their gates. The inverters 310 and 320 respectively output low when the inputs thereof are high and output high when the inputs thereof are low. The resistor 209 connects the switch 201 and the switch 202. The resistor 210 connects the switch 207 and the switch 208.

The gate control circuit 110 generates the signals at the terminals 111, 112, 113, 114 with relative timing by propagating sequential signals at the terminals 111, 112, 113, and 114 starting from the switch 208, the inverter 320, the switch 202, the inverter 310 (the signals are inputted from the switch 202 and allowed by opening switch 201), and the switch 207 during an ON PWM duty cycle; and propagating the sequential inverted signals at the terminals 113, 114, 111, and 112 starting from the switch 201, the inverter 310, the switch 207, the inverter 320 (the signals are inputted from the switch 207 and allowed by opening the switch 208), and the switch 202 during an OFF PWM duty cycle. These two sequential operations on the switches and inverters ensure the relative timing control for the H-bridge circuit 120.

In this embodiment, in the H-bridge circuit 120, the switches 121 and 124 are high side switches which are closed when their buffers 116 and 117 are fed with low input respectively and open when their buffers 116 and 117 are fed with high input respectively. The switches 122 and 123 are low side switches which are closed when their buffers 118 and 119 are fed with high inputs respectively and open when their buffers 118 and 119 are fed with low inputs respectively.

The switches 121, 122, 123 and 124 represent the electronic switches such as Field Effect Transistors (FETs), Bipolar Junction Transistors (BJTs), insulated gate bipolar transistors (IGBTs), relays and etc., which are closed and opened by the control signals on the terminals 111, 112, 113 and 114 via buffers 116, 118, 119 and 117 respectively.

Figure 3:
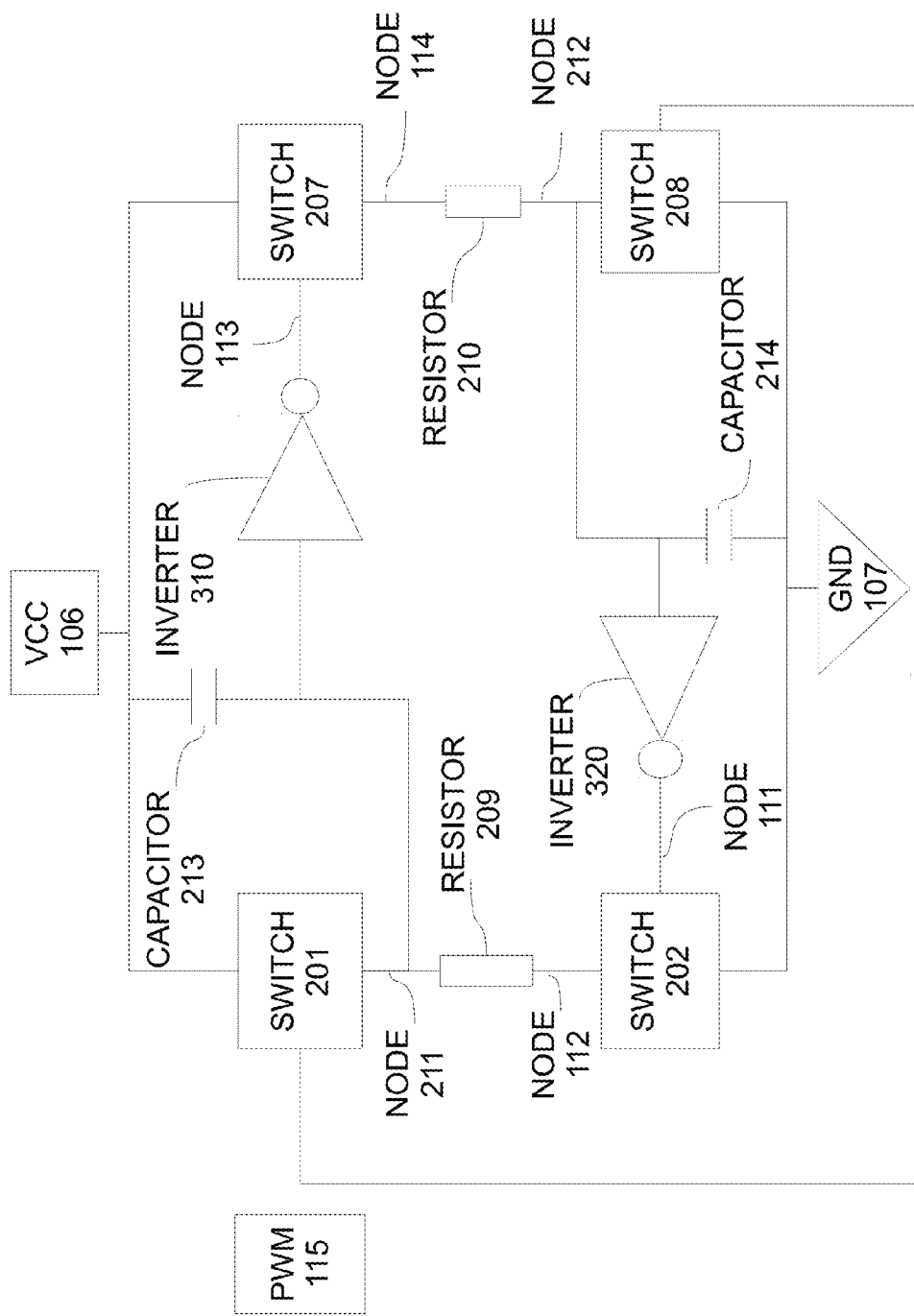
FIG. 3 is a schematic circuit diagram of the gate control circuit according to another embodiment of the present patent application.

The single PWM signal 115 inputs to the gate control circuit 110 or 130, which are shown in FIG. 2 and FIG. 3 respectively. The signals on the terminals 111, 112, 113, 114 connect to the buffer 116 of the switch 121, the buffer 118 of the switch 122, the buffer 119 of the switch 123 and the buffer 117 of the switch 124 respectively.

Figure 4A:
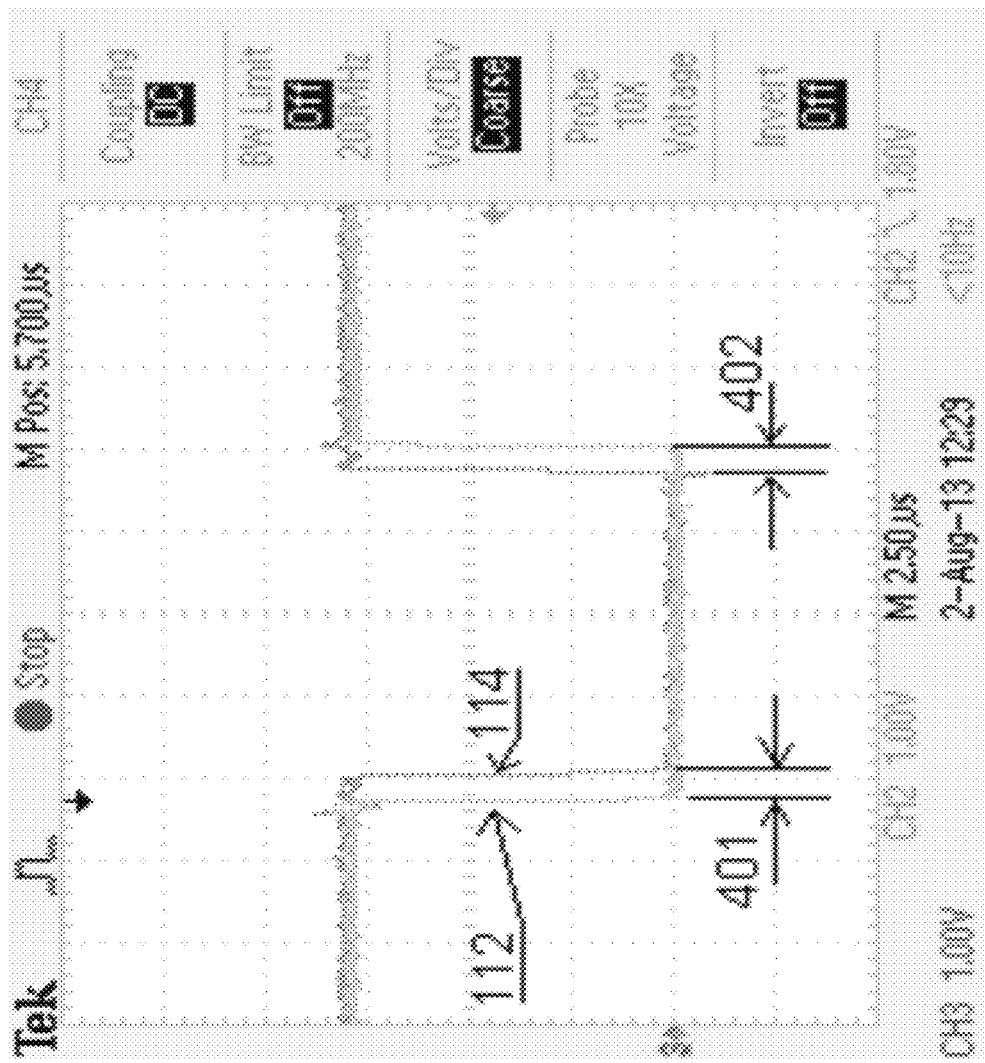
FIG. 4A shows left side H-Bridge gate control signals during a PWM ON duty cycle.
Figure 4B:
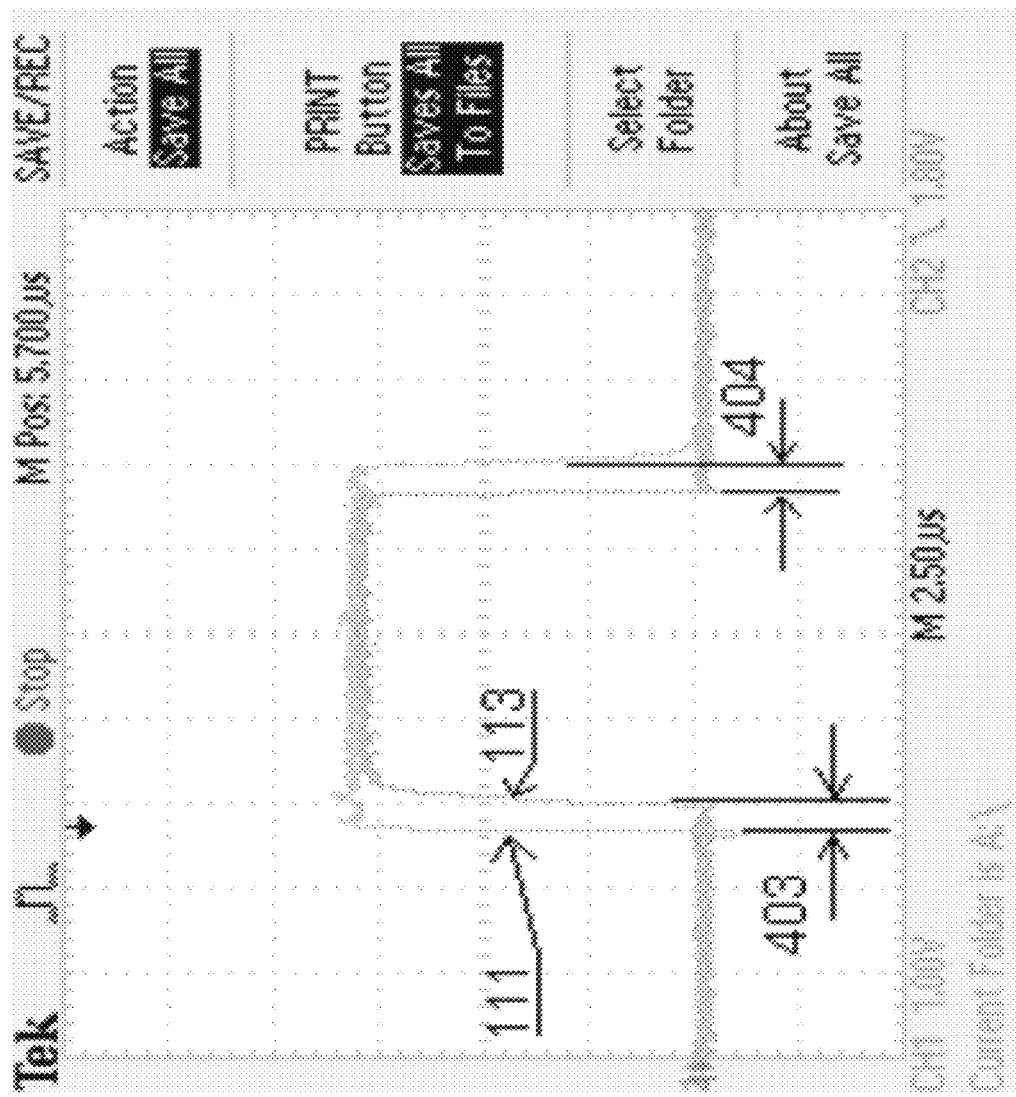
FIG. 4B shows right side H-Bridge gate control signals during PWM ON duty cycle.

The switches 121 and 123 will not be closed at the same time under the control of signals on the terminals 111 and 113 according to the signal timing control for the right side of H-bridge 120 shown in FIG. 4B; otherwise, the switch 121 and 123 will have a shooting through current.

The switches 122 and 124 will not be closed at the same time under the control of signals on the terminals 112 and 114 according to the signal timing control for the left side of H-bridge 120 shown in FIG. 4A; otherwise, the switches 122 and 124 will have a shooting through current.

The buffers 116, 117, 118, 119 may be as simple as direct lines and may be as complicated as gate drivers. The selection of the buffers depends on the supply voltage VPWR 104 of the H-bridge circuit 120 and the nature of the switches 121, 122, 123 and 124.

FIG. 3 is a schematic circuit diagram of the gate control circuit 130 according to another embodiment of the present patent application. Comparing to the gate control circuit 110 in FIG. 2, two capacitors 213 and 214 are added to the gate control circuit 110 to form the gate control circuit 130 for additional time gap control. More specifically, the capacitor 213 is added to connect between the input of the inverter 310 and the voltage source VCC 106. The capacitor 214 is added to connect between the input of the inverter 320 and the ground reference GND 107. This introduces extra delay for making longer time gaps 401, 402, 403 and 404, in order to compensate the propagation delay of buffers 116, 118, 119, 117 and the turn-on/off delay of the switches 121, 122, 123, 124 respectively. The time gaps 401, 402, 403 and 404 are defined and illustrated in FIGS. 4A and 4B. Referring to FIG. 3, resistor 209 and capacitor 213 form a RC time constant for the time gaps 401 and 403. Resistor 210 and capacitor 214 form a RC time constant for the time gaps 402 and 404.

The gate control circuit 130 generates the signals at the terminals 111, 112, 113, 114 with the relative timing by propagating the sequential signals at the terminals 111, 112, 113 and 114 starting from the switch 208, the inverter 320, the switch 202, the inverter 310 (the signals inputted from the switch 202 are delayed by the resistor 209 and the capacitor 213), the switch 207 during an ON PWM duty cycle, and propagating the sequential inverted signals 113, 114, 111 and 112 starting from the switch 201, the inverter 310, the switch 207, the inverter 320 (the signals inputted from switch 207 are delayed by the resistor 210 and the capacitor 214), and the switch 202 during an OFF PWM duty cycle. These two sequential operations on the switches and inverters ensure the relative timing control for the H-bridge circuit 120.

Figure 4C:
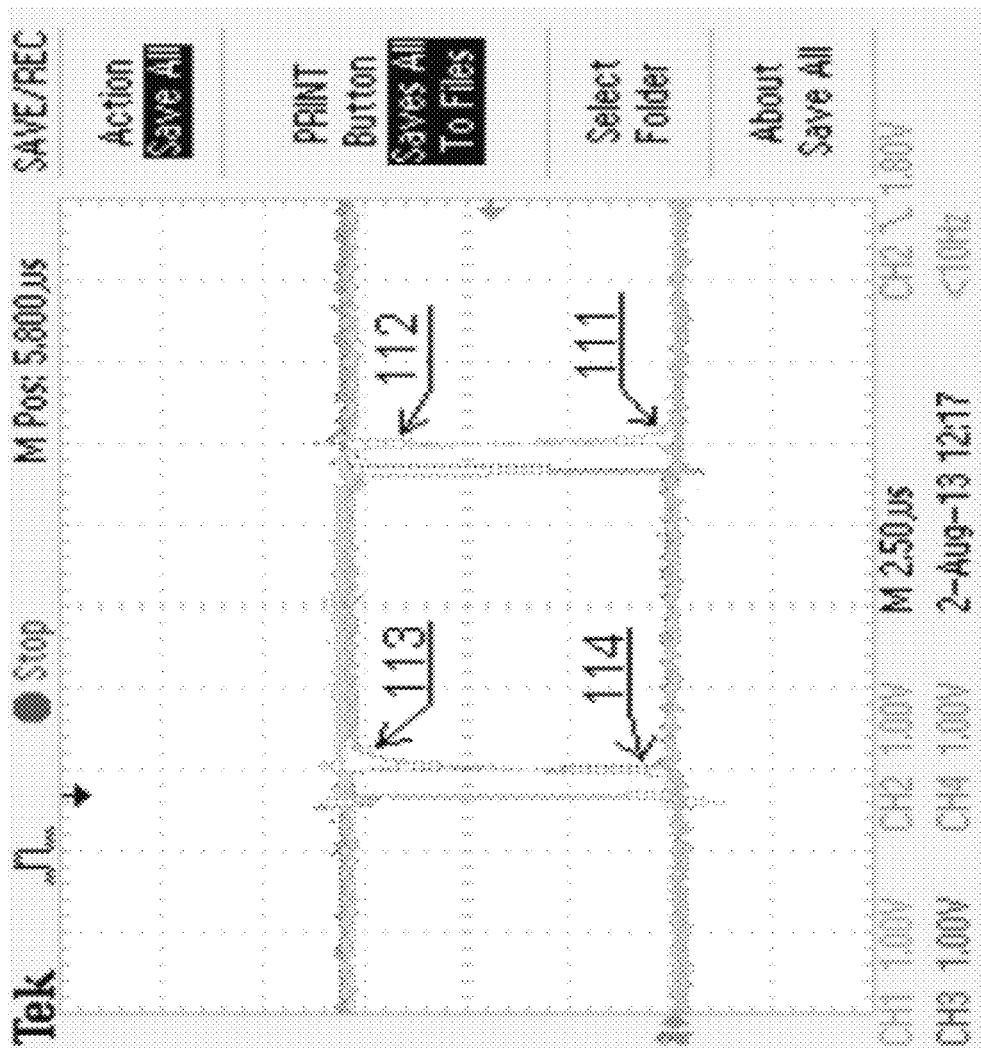
FIG. 4C shows left side and right side H-Bridge gate control signals during a PWM ON duty cycle.

The gate control circuit 110 shown in FIG. 2 or the gate control circuit 130 shown in FIG. 3 is configured to generate four signals from terminals 111, 112, 113, 114 respectively with the relative timing as shown in FIGS. 4A, 4B and 4C. The H-bridge circuit 120 is thus prevented from having a shooting-through current by the gate control circuit 110 or the gate control circuit 130, which controls the timing of gate control signals on the terminals 111, 112, 113 and 114.

Referring to FIG. 1 and FIG. 2, the detailed operation of gate control circuit 110 is as follows. After the gate control circuit 110 is powered up by applying the VCC 106, with the PWM 115 being low, at an initial steady state, the switch 201 is closed. The voltage at the node 211 is high, which is fed to the input of the inverter 310, making the output of the inverter 310, i.e. the voltage at node 113, low. Switch 207 is closed and the voltage at node 114 is high. Since switch 208 is controlled to be open by the PWM 115, the input voltage to the inverter 320 is high and then the voltage at node 111 is low. Switch 202 is thus open and the voltage at node 112 is high.

When the PWM signal 115 rises from low voltage to high voltage for an ON PWM duty cycle, the switch 201 is open and the switch 208 is closed. The switch 201 being open releases the locking for the input voltage to the inverter 310. The switch 208 being closed locks the voltage at the node 212 to be low. It turns out that the inverter 320 outputs high voltage at the node 111 so that the signal at the terminal 111 is high. Then the voltage at the node 111 being high closes the switch 202 and the voltage at the node 112 becomes low so that the signal at the terminal 112 is low and the voltage at the node 211 is low since the switch 201 has already been opened by the PWM signal 115. It turns out that the inverter 310 outputs a high voltage at the node 113 so that the signal at the terminal 113 is high, which comes after the signal at the terminal 111 is high. The voltage at the node 113 being high opens the switch 207 so as to allow the node 114 to follow the node 212 to have a low voltage since the switch 208 has been closed by the PWM 115 and as a result the signal at the terminal 114 is low, which comes after the signal 112 is low. The signal propagation cycle completes and the circuit enters into a steady state until the PWM 115 starts an OFF PWM duty cycle.

When the PWM signal 115 falls from high voltage to low voltage for an OFF PWM duty cycle, the switch 201 is closed and the switch 208 is open. The switch 208 being open releases the locking for the input voltage to the inverter 320. The switch 201 being closed locks the voltage at the node 211 to be high. It turns out that the inverter 310 outputs low voltage at the node 113 so that the signal at the terminal 113 is low. Then the voltage at the node 113 being low closes the switch 207 and the voltage at the node 114 becomes high so that the signal at the terminal 114 is high and the voltage at the node 212 is high since the switch 208 has already been opened by the PWM signal 115. It turns out that the inverter 320 outputs a low voltage at the node 111 so that the signal at the terminal 111 is low, which comes after the signal at the terminal 113 is low. The voltage at the node 111 being low opens the switch 202 so as to allow the node 112 to follow the node 211 to have a high voltage since the switch 201 has been closed by the PWM signal 115 and as a result the signal at the terminal 112 is high, which comes after the signal 114 is high. The signal propagation cycle completes and the circuit enters into a steady state until the PWM signal 115 starts an ON PWM duty cycle.

As the inverters of the gate control circuit 110 switch as fast as they can to propagate the signals, the time gaps 401, 402, 403 and 404 may be increased in order to compensate the propagation delays of buffers 116, 118, 119, 117 and the turn-on/off delays of the switches 121, 122, 123, 124 respectively of the H-bridge circuit 120. The capacitors 213 and 214 are added to the gate control circuit 110 to form the gate control circuit 130. The resistor 209 and the capacitor 213 form a RC circuit providing an extra switch delay to adjust the time gap 401 and 403 between the voltage at the node 112 and the voltage at the node 113. The resistor 210 and the capacitor 214 form a RC circuit providing an extra switch delay to adjust the time gaps 402 and 404 between the voltage at the node 114 and the voltage at the node 111.

Referring to FIG. 1 and FIG. 3, the detailed operation of the gate control circuit 110 is as follows. After the gate control circuit 130 is powered up by applying the VCC 106, with the PWM signal 115 being low, at an initial steady state, the switch 201 is closed. The capacitor 213 has no charge. The voltage at the node 211 is high, so is the input voltage to the inverter 310, which makes the output of the inverter 310, i.e. the node 113, low. The switch 207 is closed, the voltage at the node 114 is high. Since the switch 208 is controlled to be open by the PWM signal 115, the input voltage to the inverter 320 is high and the voltage at the node 111 is low. The capacitor 214 is fully charged. The switch 202 is thus open and the voltage at the node 112 is high.

When the PWM signal 115 rises from low voltage to high voltage for an ON PWM duty cycle, the switch 201 is open and the switch 208 is closed. The switch 201 being open releases the locking for the input voltage to the inverter 310. The capacitor 213 keeps the high voltage at the node 211 until the capacitor 213 is charged up via the resistor R209 when the voltage at the node 112 is low. This charging action allows longer time gaps 401 and 403 for the output voltage of inverter 310 to be high at the node 113. The switch 208 being closed locks the voltage at the node 212 to be low. The capacitor 214 discharges immediately. It turns out that the inverter 320 outputs high voltage at node 111 so that the signal at the terminal 111 is high. Then the voltage at the node 111 being high closes the switch 202 and the voltage at the node 112 becomes low, and also charges up the capacitor 213 via the resistor 209 to make the voltage at the node 211 low after charging since the switch 201 has already been opened by the PWM signal 115. It turns out that the inverter 310 outputs high voltage at the node 113 so that the signal at terminal 113 is high, which comes after the signal at the terminal 111 is high. The node 113 being high opens the switch 207 so as to allow the node 114 to follow the node 212 to have a low voltage since the switch 208 has been closed by the PWM signal 115 and as a result the signal at terminal 114 is low, which comes after the signal at the terminal 112 is low. The signal propagation cycle completes and the circuit enters into a steady state until the PWM 115 signal starts an OFF PWM duty cycle.

When the PWM signal 115 falls from high voltage to low voltage for an OFF PWM duty cycle, the switch 201 is closed and the switch 208 is open. The switch 208 being open releases the locking for the input voltage to the inverter 320. The capacitor 214 keeps the low voltage at the node 212 until the capacitor 214 is charged up via the resistor R210 when the voltage at the node 114 is high. This charging action allows longer time gaps 402 and 404 for the output voltage of inverter 320 to be high at the node 111. The switch 201 being closed locks the voltage at the node 211 to be high. The capacitor 213 discharges immediately. It turns out that the inverter 310 outputs low voltage at the node 113 so that the signal at the terminal 113 is low. Then the voltage at the node 113 being low closes the switch 207 and the voltage at the node 114 becomes high, and also charges up the capacitor 214 via the resistor 210 to make the voltage at the node 212 high after charging since the switch 208 has already been opened by the PWM signal 115. It turns out that the inverter 320 outputs low voltage at the node 111 so that the signal at terminal 111 is low, which comes after the signal at the terminal 113 is low. The voltage at the node 111 being low opens the switch 202 so as to allow the node 112 to follow the node 211 to have a high voltage since the switch 201 has been closed by the PWM signal 115 and as a result the signal at the terminal 112 is high, which comes after the signal at the terminal 114 is high. The signal propagation cycle completes and the circuit enters into a steady state until the PWM signal 115 starts an ON PWM duty cycle.

The pair of resistor R209 and capacitor 213 and the pair of resistor R210 and capacitor 214 form a RC time constant for adjusting the width of time gap 401, 403 and 402 404 respectively and preventing the switches of the H-bridge circuit 120 from having a shooting-through current.

The sequences of signal generation of the gate control circuits 110 and 130 are tabulated as in Table 1.

TABLE 1

Sequence of signal generation

| PWM 115 | Switch 201 | Switch 208 | State | Time sequence | Node 111 | Node 112 | Node 113 | Node 114 |
|---|---|---|---|---|---|---|---|---|
| OFF | Close | Open | Steady | 0 | Low | High | Low | High |
| ON | Open | Close | Propagation | 1.0 | High | High | Low | High |
| | | | | 1.1 | High | Low | Low | High |
| | | | | 1.2 | High | Low | High | High |
| | | | Steady | 1.3 | High | Low | High | Low |
| OFF | Close | Open | Propagation | 2.0 | High | Low | Low | Low |
| | | | | 2.1 | High | Low | Low | High |
| | | | | 2.2 | Low | Low | Low | High |
| | | | Steady | 2.3 | Low | High | Low | High |

Figure 6:
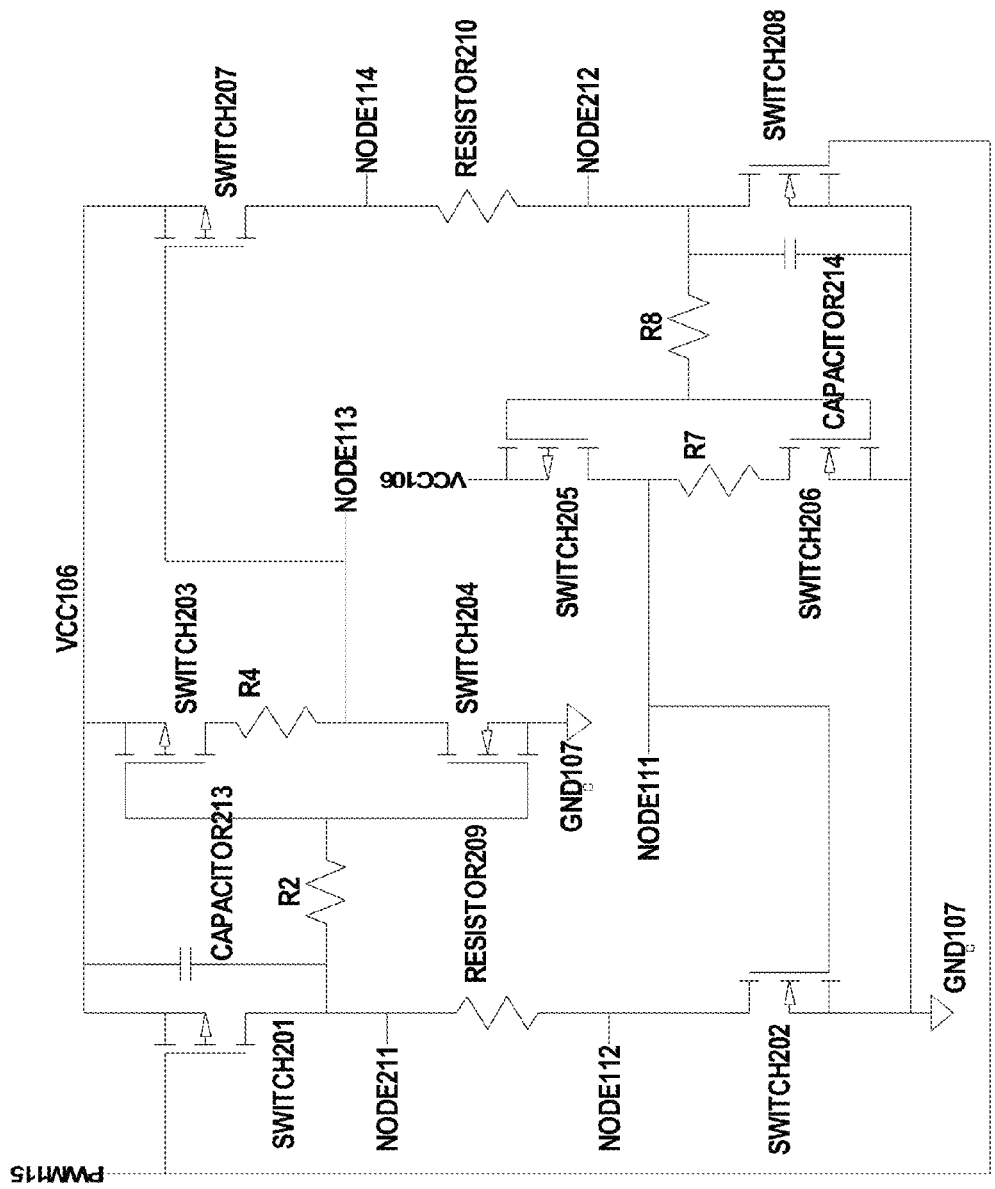
FIG. 6 shows a Field Effect Transistor (FET) implementation of a gate control circuit according to an embodiment of the present patent application.

In one embodiment, Field Effect Transistors (FETs) are used for implementing the switches 201, 202, 207 and 208 and the inverters 310 and 320. FIG. 6 shows the details of the implementation. The advantage of the FET implementation is that the circuit can operate at high speed with no steady loss.

Figure 7:
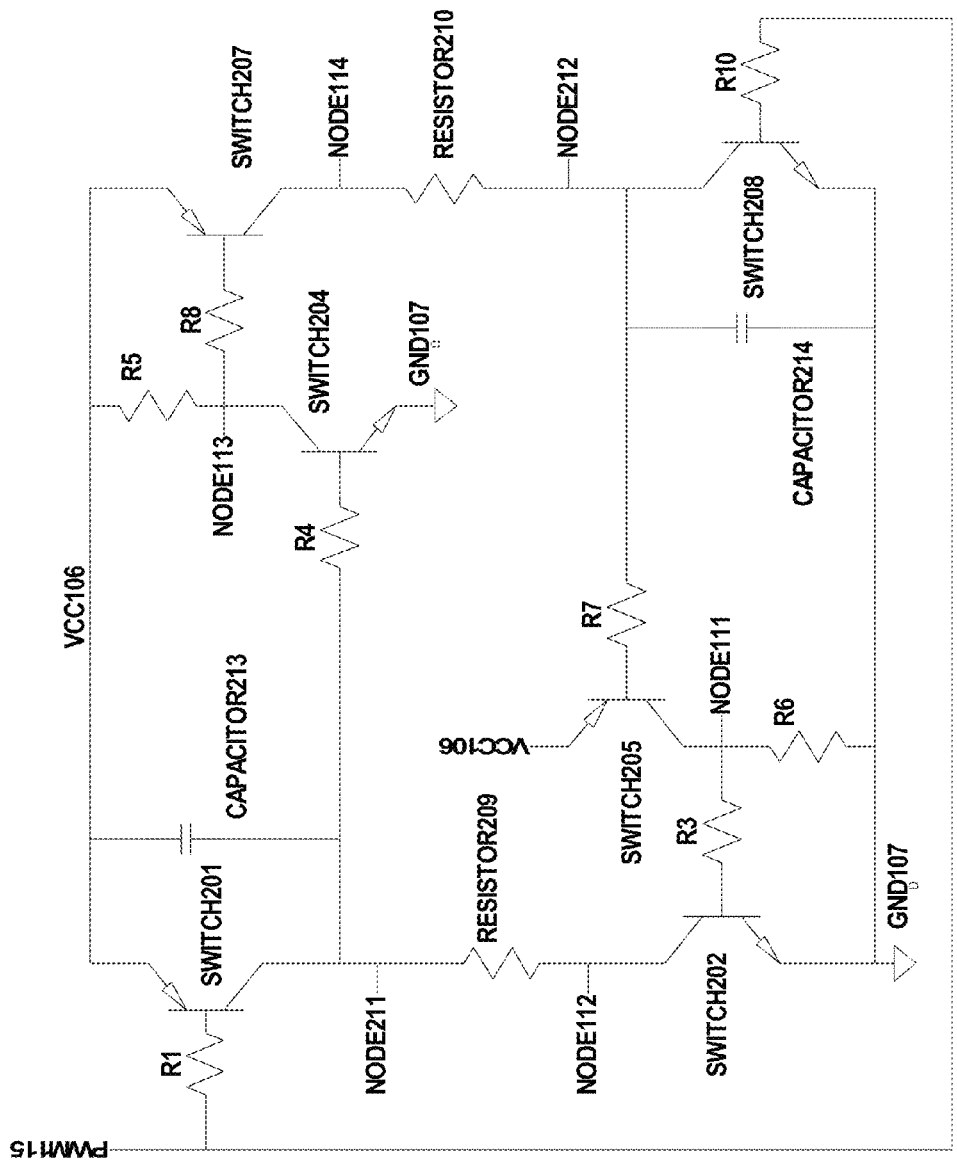
FIG. 7 shows a Bipolar Junction Transistor (BJT) implementation of a gate control circuit according to an embodiment of the present patent application.

In another embodiment, Bipolar Junction Transistors (BJTs) are used for implementing the switches 201, 202, 207 and 208 and the inverters 310 and 320. FIG. 7 shows the details of the implementation. The advantage of the BJT implementation is that the circuit is very simple and the cost is low.

It is noted that the gate control circuit in the above embodiments can be applied to half H-Bridge circuits for preventing an upper side switch and a lower side switch from having a shooting-through current.

It is further noted that the left half side of the full H-Bridge circuit and the right half side of the full H-Bridge circuit can be independently operated by two independent gate control circuits in the above embodiments with two independent PWMs.

Referring to FIGS. 1, 2 and 3, the output of the inverter 320, i.e. the node 111, is configured to control an upper side switch 121 of a right half side of the H-bridge circuit 120 through the buffer 116, while the output of the inverter 310, i.e. the node 113, is configured to control a lower side switch 123 of that right half side of the H-bridge circuit 120 through the buffer 119. Voltage at an end of the resistor 210, i.e. the node 114, is configured to control an upper side switch 124 of a left half side of the H-bridge circuit 120 through the buffer 117, voltage at an end of the resistor 209, i.e. the node 112, is configured to control a lower side switch 122 of that half left side of the H-bridge circuit 120 through the buffer 118. The resistor 210 and the inverter 310 connect to the same switch 207, while the resistor 209 and the inverter 320 connect to the same switch 202.

In the above embodiments, the gate control circuit 110 and 130 with a single PWM input signal 115 prevent the operation of the H-bridge circuit 120 from having a shooting-through current by controlling the relative timing of signal 111, 112, 113, 114.

With the input signal PWM 115, the gate control circuit output signals at the terminals 111, 112, 113, 114 with relative timings shown in FIGS. 4A, 4B and 4C. The voltage source (power supply) VPWR 104 supplies a positive voltage to the H-bridge circuit 120. The voltage source VCC 106 supplies a positive voltage to the gate control circuit 110 or 130 and the ground reference GND 107 provides the gate control circuit 110 or 130 the reference ground which is the same as the reference ground of the H-bridge circuit 120. The relative timings of the signals at the terminals 111, 112, 113 and 114 are set in the following manner.

Referring to FIGS. 4A, 4B and 4C, signal 111 changes from low to high before signal 113 changes from low to high while signal 113 changes from high to low before signal 111 changes from high to low. Signal 112 changes from high to low before signal 114 changes from high to low while signal 114 changes from low to high before signal 112 changes from low to high. The time gaps 401, 402, 403 and 404 determined by the capacitors 213 and 214 and the resistors 209 and 210 are sufficiently long to avoid the shooting-through current due to the propagation delays of the buffers 116, 118, 119, 117 and the turn-on/off delays of the switches 121, 122, 123 and 124 respectively.

Figure 5:
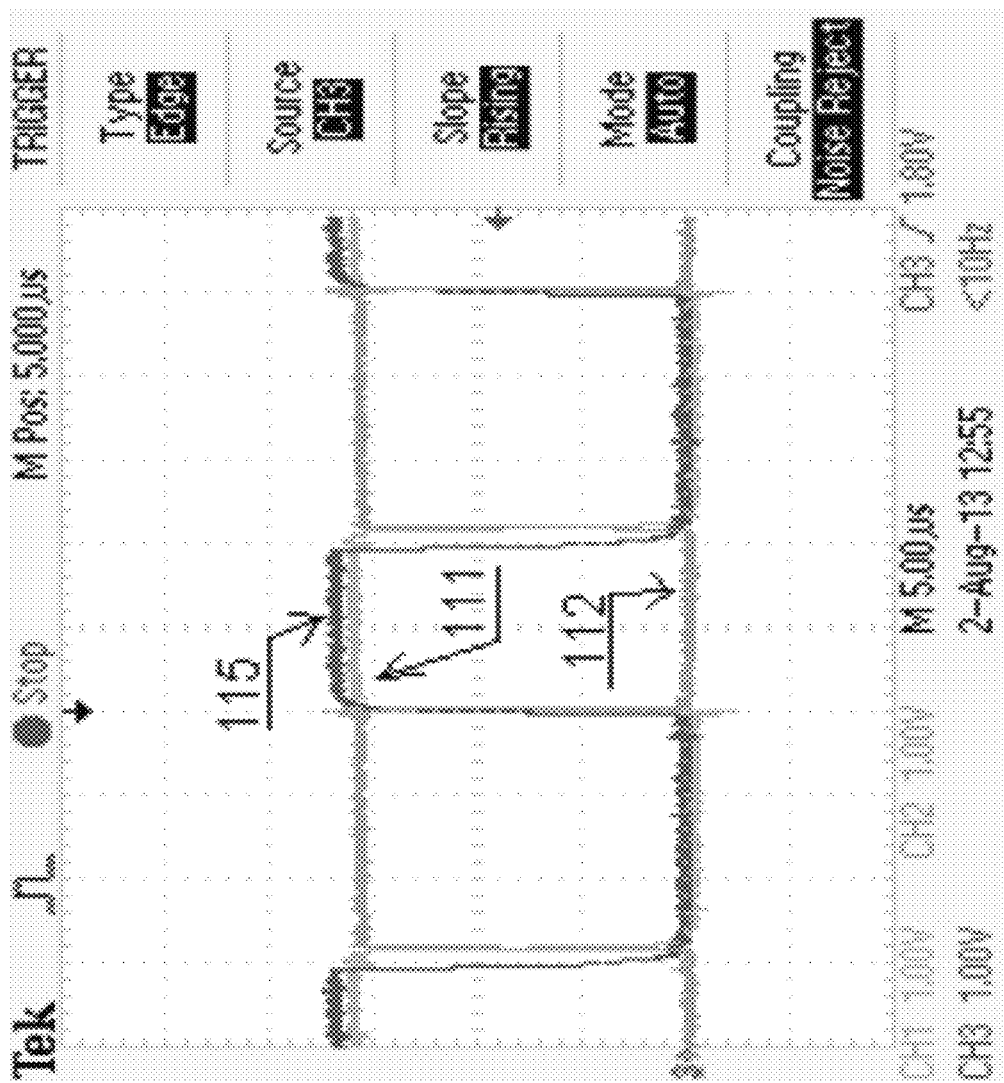
FIG. 5 shows a PWM signal and its relationships with two gate control signals.

FIG. 5 shows a PWM signal and its relationships with two gate control signals. As shown in FIG. 5, signal 111 follows the PWM signal 115, and signal 112 is out of phase of signal 111.

According to another embodiment of the present patent application, a method for controlling the relative timing includes: propagating sequential signals at the terminals 111, 112, 113, and 114 starting from the switch 208, the inverter 320, the switch 202, the inverter 310 (the signals are inputted from the switch 202 and allowed by opening switch 201), and the switch 207 during an ON PWM duty cycle; and propagating the sequential inverted signals at the terminals 113, 114, 111, and 112 starting from the switch 201, the inverter 310, the switch 207, the inverter 320 (the signals are inputted from the switch 207 and allowed by opening the switch 208), and the switch 202 during an OFF PWM duty cycle. These two sequential operations on the switches and inverters ensure the relative timing control for the H-bridge circuit 120.

In the above embodiments, the H-bridge gate control circuit has the advantages of simplicity, extremely high speed, no steady loss, and reliability. The circuit is very simple. The switch speed is only limited by inverters delay, that is, two propagation delays of two transistors. Energy saving is achieved because the circuit consumes power only during switching and there is no loss at the steady state. Reliability is very important for shooting-through current prevention in a number of critical applications.

It is noted that in the above embodiments, some embodiments provide high speed design, some embodiments provide low cost design, some embodiments provide high reliability and some embodiments provide no steady loss.

While the present patent application has been shown and described with particular references to a number of embodiments thereof, it should be noted that various other changes or modifications may be made without departing from the scope of the present invention.

What is claimed is:

1. A gate control circuit for controlling gates of at least a half side of an H-bridge circuit, the gate control circuit comprising:
   an input terminal configured to connect to a PWM signal;
   a power terminal configured to connect to a voltage source that supplies a positive voltage;
   a ground terminal configured to connect to a ground reference; and
   a control circuit connected with the input terminal, the power terminal, and the ground terminal, the control circuit comprising:
      two high side switches configured to be connected with the voltage source respectively through the power terminal;
      two low side switches configured to be connected with the ground reference respectively through the ground terminal;
      a first inverter connecting the two high side switches;
      a second inverter connecting the two low side switches;
      a first resistor and a second resistor connecting the two high side switches to the two low side switches respectively;
      a first capacitor connected between the power terminal and an input of the first inverter; and
      a second capacitor connected between the ground terminal and an input of the second inverter; wherein:
   one of the high side switches and one of the low side switches are respectively connected with the input terminal and configured to be controlled by the PWM signal; and
   the high side switches are respectively open when high inputs are fed to gates thereof and closed when low inputs are fed to gates thereof, while the low side switches are respectively open when low inputs are fed to gates thereof and closed when high inputs are fed to gates thereof.

2. The gate control circuit of claim 1, wherein an output of the second inverter is configured to control an upper side switch of a half side of the H-bridge circuit, while the output of the first inverter is configured to control a lower side switch of that half side of the H-bridge circuit.

3. The gate control circuit of claim 2, wherein an output of the second inverter is configured to control an upper side switch of a half side of the H-bridge circuit through a first buffer, while the output of the first inverter is configured to control a lower side switch of that half side of the H-bridge circuit through a second buffer.

4. The gate control circuit of claim 1, wherein voltage at an end of the first resistor is configured to control an upper side switch of a half side of the H-bridge circuit, voltage at an end of the second resistor is configured to control a lower side switch of that half side of the H-bridge circuit, the first resistor and the first inverter connect to the same switch, while the second resistor and the second inverter connect to the same switch.

5. A gate control circuit for controlling gates of at least a half side of an H-bridge circuit, the gate control circuit comprising:
   an input terminal configured to connect to a PWM signal;
   a power terminal configured to connect to a voltage source that supplies a positive voltage;
   a ground terminal configured to connect to a ground reference; and
   a control circuit connected with the input terminal, the power terminal, and the ground terminal, the control circuit comprising:
      two high side switches configured to be connected with the voltage source respectively through the power terminal;
      two low side switches configured to be connected with the ground reference respectively through the ground terminal;
      a first inverter connecting the two high side switches;
      a second inverter connecting the two low side switches; and
      a first resistor and a second resistor connecting the two high side switches to the two low side switches respectively; wherein:
   one of the high side switches and one of the low side switches are respectively connected with the input terminal and configured to be controlled by the PWM signal;
   the high side switches are respectively open when high inputs are fed to gates thereof and closed when low inputs are fed to gates thereof, while the low side switches are respectively open when low inputs are fed to gates thereof and closed when high inputs are fed to gates thereof; and
   the high side switches, the low side switches, and the inverters are implemented by Field Effect Transistors or Bipolar Junction Transistors.

6. The gate control circuit of claim 5 further comprising a first capacitor and a second capacitor, wherein the first capacitor is connected between the power terminal and an input of the first inverter, while the second capacitor is connected between the ground terminal and an input of the second inverter.

7. The gate control circuit of claim 5, wherein an output of the second inverter is configured to control an upper side switch of a half side of the H-bridge circuit, while the output of the first inverter is configured to control a lower side switch of that half side of the H-bridge circuit.

8. The gate control circuit of claim 7, wherein an output of the second inverter is configured to control an upper side switch of a half side of the H-bridge circuit through a first buffer, while the output of the first inverter is configured to control a lower side switch of that half side of the H-bridge circuit through a second buffer.

9. The gate control circuit of claim 5, wherein voltage at an end of the first resistor is configured to control an upper side switch of a half side of the H-bridge circuit, voltage at an end of the second resistor is configured to control a lower side switch of that half side of the H-bridge circuit, the first resistor and the first inverter connect to the same switch, while the second resistor and the second inverter connect to the same switch.

10. The gate control circuit of claim 9, wherein voltage at an end of the first resistor is configured to control an upper side switch of a half side of the H-bridge circuit through a first buffer, while voltage at an end of the second resistor is configured to control a lower side switch of that half side of the H-bridge circuit through a second buffer.

11. The gate control circuit of claim 8, wherein the first and second buffers are direct lines or gate drivers.

12. A gate control circuit for controlling gates of at least a half side of an H-bridge circuit, the gate control circuit comprising:
   an input terminal configured to connect to a PWM signal;
   a power terminal configured to connect to a voltage source that supplies a positive voltage;
   a ground terminal configured to connect to a ground reference; and a control circuit connected with the input terminal, the power terminal, and the ground terminal, the control circuit comprising:
- two high side switches configured to be connected with the voltage source respectively through the power terminal;
- two low side switches configured to be connected with the ground reference respectively through the ground terminal;
- a first inverter connecting the two high side switches;
- a second inverter connecting the two low side switches; and
- a first resistor and a second resistor connecting the two high side switches to the two low side switches respectively; wherein:

one of the high side switches and one of the low side switches are respectively connected with the input terminal and configured to be controlled by the PWM signal.

13. The gate control circuit of claim 12, wherein the high side switches are respectively open when high inputs are fed to gates thereof and closed when low inputs are fed to gates thereof, while the low side switches are respectively open when low inputs are fed to gates thereof and closed when high inputs are fed to gates thereof.

14. The gate control circuit of claim 12, wherein the high side switches, the low side switches, and the inverters are implemented by Field Effect Transistors or Bipolar Junction Transistors.

15. The gate control circuit of claim 12 further comprising a first capacitor and a second capacitor, wherein the first capacitor is connected between the power terminal and an input of the first inverter, while the second capacitor is connected between the ground terminal and an input of the second inverter.

16. The gate control circuit of claim 12, wherein an output of the second inverter is configured to control an upper side switch of a half side of the H-bridge circuit, while the output of the first inverter is configured to control a lower side switch of that half side of the H-bridge circuit.

17. The gate control circuit of claim 16, wherein an output of the second inverter is configured to control an upper side switch of a half side of the H-bridge circuit through a first buffer, while the output of the first inverter is configured to control a lower side switch of that half side of the H-bridge circuit through a second buffer.

18. The gate control circuit of claim 12, wherein voltage at an end of the first resistor is configured to control an upper side switch of a half side of the H-bridge circuit, voltage at an end of the second resistor is configured to control a lower side switch of that half side of the H-bridge circuit, the first resistor and the first inverter connect to the same switch, while the second resistor and the second inverter connect to the same switch.

19. The gate control circuit of claim 18, wherein voltage at an end of the first resistor is configured to control an upper side switch of a half side of the H-bridge circuit through a first buffer, while voltage at an end of the second resistor is configured to control a lower side switch of that half side of the H-bridge circuit through a second buffer.

20. The gate control circuit of claim 19, wherein the first and second buffers are direct lines or gate drivers.

* * * * *